United States Patent [19]

deGeest, Jr.

[11] Patent Number: 4,841,906
[45] Date of Patent: Jun. 27, 1989

[54] MASS TRANSFERABLE SEMICONDUCTOR SUBSTRATE PROCESSING AND HANDLING FULL SHELL CARRIER (BOAT)

[75] Inventor: Charles E. deGeest, Jr., Marble Falls, Tex.

[73] Assignee: Heraeus Amersil, Inc., Sayreville, N.J.

[21] Appl. No.: 180,722

[22] Filed: Apr. 4, 1988

Related U.S. Application Data

[63] Continuation of Ser. No. 929,965, Nov. 12, 1986, abandoned.

[51] Int. Cl.⁴ ............................................. B05C 13/02
[52] U.S. Cl. .................................... 118/500; 118/728
[58] Field of Search .................... 118/500, 725, 728; 269/903; 211/41

[56] References Cited

U.S. PATENT DOCUMENTS

| | | | |
|---|---|---|---|
| 3,828,722 | 8/1974 | Reuter et al. | 118/725 |
| 3,834,349 | 9/1974 | Dietze et al. | 211/41 X |
| 4,098,923 | 7/1978 | Alberti et al. | 118/500 |
| 4,220,116 | 9/1980 | Hochberg | 118/728 |
| 4,318,749 | 3/1982 | Mayer | 211/41 |
| 4,466,381 | 8/1984 | Jenkins | 118/728 |
| 4,515,104 | 5/1985 | Lee | 118/500 |
| 4,572,101 | 2/1986 | Lee | 211/41 |
| 4,615,909 | 10/1986 | Thijssen et al. | 118/725 X |

Primary Examiner—Shrive Beck
Assistant Examiner—Alain Bashore
Attorney, Agent, or Firm—Sprung Horn Kramer & Woods

[57] ABSTRACT

A carrier for mass transferable semiconductor substrate processing and handling comprises a two part shell including top and bottom semicylindrical halves made from clear fused quartz tubing and releasably assembled to form a cylindrical shell. A semiconductor substrate carrier is removably suspendable in the shell when assembled, and includes four clear fused quartz rods having axially running slots for supporting substrates and clear fused quartz end braces connected to the ends of the rods and clear fused quartz pick-up tubes connected to the end braces.

6 Claims, 1 Drawing Sheet

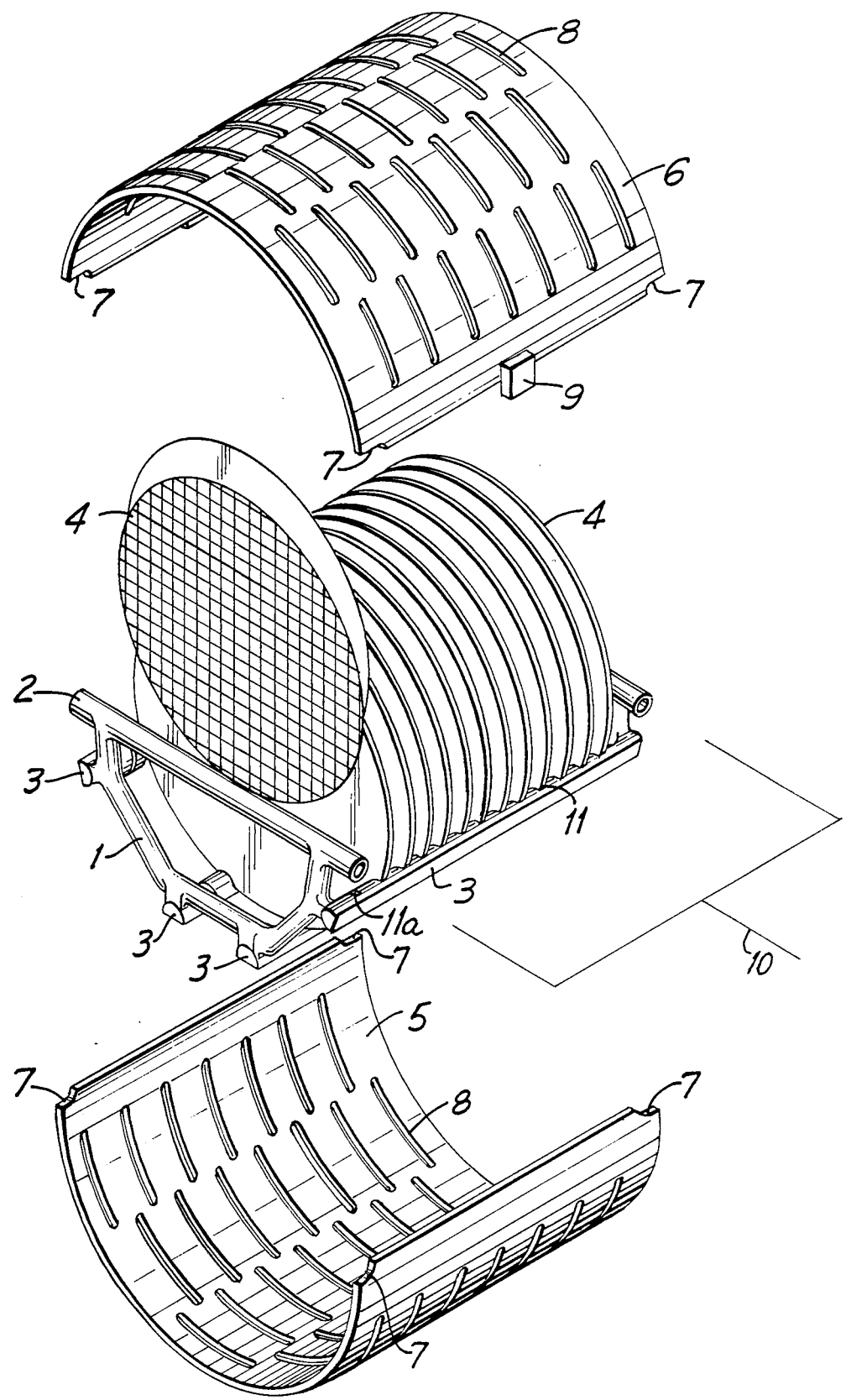

MASS TRANSFERABLE SEMICONDUCTOR SUBSTRATE PROCESSING AND HANDLING FULL SHELL CARRIER (BOAT)

This application is a continuation of application Ser. No. 929,965, filed Nov. 12, 1986 and now abandoned.

BACKGROUND OF THE INVENTION

This invention relates to an article of manufacture, and specifically to a mass transferable semiconductor substrate processing and handling full shell carrier, to receive and hold disc or plate-like semiconductor substrates for subsequent processing; for example, in an oxidation or polycrystaline diffusion tube apparatus.

Various types of processing and handling carriers for semiconductor substrates are used in the industry. One type consists of a clear fused quartz tube section (full shell) with either slots or holes cut in the shell to allow gas flow, and a semi standard style wafer carried suspended inside this shell. This type of carrier has been used in the industry under part number 4668 series manufactured by Worden Products, subsidiary of Heraeus Amersil, Incorporated, and described in the catalog thereof. The semiconductor substrates are loaded into the "semi standard" type carrier in any one of, but not limited to, three load configurations. The first load configuration being 26 substrates being loaded back to back in pairs of 2 into 13 supporting slots. The second load configuration being 26 substrates being loaded back to back in 26 separate slots, this being a "proximity" back to back load. The third load configuration being 52 substrates being loaded back to back in pairs of 2 into 26 supporting slots. The "semi-standard" style wafer carrier is then placed into the bottom half of the shell and the top half of the shell is placed over the wafer carrier. This complete assembly is then loaded into the diffusion furnace tube for subsequent processing.

SUMMARY OF THE INVENTION

It is a main object of the present invention to provide a mass transferable holder for semiconductor substrates that is made of clear fused quartz, has the desirable properties of a full shell carrier and has either fully enclosed ends or open ends as dictated by the diffusion equipment for processing these semiconductor substrates.

Briefly, the semiconductor substrate processing and handling carrier consists of a two part outer full shell with or without closed ends, and an inner semiconductor substrate "semi standard" carrier that is suspended in the shell. The shell can have longitudinal or transverse slots in the top half, bottom half, or both halves. The shell may also have round holes in the top half, bottom half or both halves. These slots or holes are provided to permit gas flows into the shell. The semi standard carrier is constructed of four clear fused quartz rods having support slots cut into them at a specific spacing for compatibility with mass transfer machines. The slots are provided to support the semiconductor substrates in, but not limited to, one of the three load configurations. The four slotted rods are held together by end piece assemblies at both ends. These end piece assemblies consist of a bent clear fused quartz rod and a clear fused quartz tube. The tubes on the end piece assembly are for access by a pick up handle.

BRIEF DESCRIPTION OF THE DRAWING

The single FIGURE is a highly schematic view of the mass transferable semiconductor substrate processing and handling full shell carrier and handling fork for handling the suspended semi standard style carrier.

DETAILED DESCRIPTION OF THE INVENTION

The semi standard carrier comprises two clear fused quartz rod end braces 1, two clear used quartz pick up tubes 2 and four clear fused quartz slotted rods 3.

The slotted rods 3 are ground flat on the side opposite slots 11 to allow semiconductor substrates 4 to sit in close proximity to outer shell halves (5,6) and be supported in a vertical plane. Outer shell halves (5,6) have transverse or longitudinal slots or round holes 8 therein to permit gas flows.

The pick-up tubes (2) are extended slightly beyond the shell halves (5,6) on both sides, allowing the semi standard boat to be suspended in the shell bottom half (5) by the pick up tubes (2).

The shell bottom half (5) and top half (6) have reliefs (7) cut at all four corners. This relief (7) is one half the outside diameter of the pick up tubes (2).

When fully assembled, the pick up tubes (2) prevent the top shell half (6) from shifting end to end. The top shell half (6) is also fitted with stop tabs (9) to prevent the top shell half (6) from shifting front to back.

The distance from the ends of the bottom two slotted rods (3) to the center line of the first slot (11a) in the slotted rods (3) is ground to a specified distance and assigned a tolerance of ±0.003"(0.0762mm) and is used as a reference plane for a mass transfer machine. The distance from the center line of slot (11) to the center line of the next slot (11) in the four slotted rods (3) is specified and assigned a tolerance of ±0.003" (0.0762 mm) noncumulatively. This distance, center line of slot (11) to center line of slot (11), is determined by load configuration and process compatibility.

The pick up tubes (2) are formed and spaced such that a pick up tool (10) can be used for handling the semi standard carrier safely whether the carrier is empty or loaded with substrates.

What is claimed is:

1. A carrier for mass transferable semiconductor substrate processing and handling, comprising: a two part shell including top and bottom semicylindrical halves made from clear fused quartz tubing and releasably assembled to form a cylindrical shell, wherein both shell halves have a relief cut in all four corners to define four slots when the halves are assembled; and a semiconductor substrate carrier including four clear fused quartz rods having axially running slots for supporting substrates and clear fused quartz end braces connected to the ends of the rods and clear fused quartz pick-up tubes connected to, and in a same plane with, the end braces and each pick-up tube having end portions extending outwardly from the end braces and configured to be accommodated in the four slots to removably suspendable in the shell when the two halves are assembled.

2. The carrier according to claim 1, wherein the rods have specified dimensions from the end of each rod to the center line of a first slot and assigned a tolerance of ±0.003" (0.0762 mm) with the first slot in each rod aligned on a common center line wherein an axis perpendicular to the longitudinal center line of the carrier and wherein the ends of the rods form a reference or indexing plane for use by a mass transfer machine.

3. The carrier according to claim 1, wherein the slots having specified center line spacing dimensions are assigned a noncumulative tolerance center line to center line of ±0.003" (0.0762 mm) to be both process and mass transfer machine compatible.

4. The carrier according to claim 1, where the shell half has a stop tab for preventing front to back shift of the shell top half when the carrier is assembled.

5. The carrier according to claim 1, wherein the pick up tubes are disposed parallel to allow access of a handling tool.

6. The carrier according to claim 1, wherein the or both of the top and bottom halves have transverse slots, longitudinal slots or round holes.

* * * * *

UNITED STATES PATENT AND TRADEMARK OFFICE
CERTIFICATE OF CORRECTION

PATENT NO. : 4,841,906

DATED : June 27, 1989

INVENTOR(S) : Charles E. deGeest, Jr

It is certified that error appears in the above-identified patent and that said Letters Patent is hereby corrected as shown below:

On the title page, item [56]: Add to U.S. PATENT DOCUMENTS
--4195871    4/1980   Chilton et al ...294/16
  4548159   10/1985   Foster et al.....118/728--

On the title page, item [56], after U.S. PATENT DOCUMENTS: Add
--FOREIGN PATENT DOCUMENTS
  2082388    3/1982   United Kingdom--.

Signed and Sealed this

Twenty-ninth Day of May, 1990

Attest:

HARRY F. MANBECK, JR.

*Attesting Officer*              *Commissioner of Patents and Trademarks*